US011173924B2

(12) United States Patent
Stefan et al.

(10) Patent No.: US 11,173,924 B2
(45) Date of Patent: Nov. 16, 2021

(54) TEST FOR SELF-DRIVING MOTOR VEHICLE

(71) Applicant: Ford Global Technologies, LLC, Dearborn, MI (US)

(72) Inventors: Frederic Stefan, Aachen (DE); Evangelos Bitsanis, Aachen (DE); Turgay Isik Aslandere, Aachen (DE); Michael Marbaix, Haillot (BE); Alain Marie Roger Chevalier, Henri-Chapelle (BE)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 322 days.

(21) Appl. No.: 16/391,794

(22) Filed: Apr. 23, 2019

(65) Prior Publication Data

US 2019/0322286 A1    Oct. 24, 2019

(30) Foreign Application Priority Data

Apr. 23, 2018  (DE) .......................... 102018206189.0

(51) Int. Cl.
| | |
|---|---|
| *B60W 50/00* | (2006.01) |
| *B60W 50/04* | (2006.01) |
| *G07C 5/08* | (2006.01) |
| *G06F 30/15* | (2020.01) |

(52) U.S. Cl.
CPC .......... *B60W 50/045* (2013.01); *G06F 30/15* (2020.01); *G07C 5/08* (2013.01); *B60W 2050/0031* (2013.01); *B60W 2050/041* (2013.01)

(58) Field of Classification Search
CPC ......... B60W 50/045; B60W 2050/041; B60W 2050/0031; B60W 60/001; B60W 2050/0088; B60W 40/09; G06F 30/15; G06F 11/3688; G07C 5/08
See application file for complete search history.

(56) References Cited

U.S. PATENT DOCUMENTS

| | | | |
|---|---|---|---|
| 7,278,316 B2 | 10/2007 | Satou et al. | |
| 7,813,888 B2* | 10/2010 | Vian | .................... G05D 1/0027 |
| | | | 702/113 |
| 8,190,295 B1* | 5/2012 | Garretson | ............ G05D 1/0038 |
| | | | 700/245 |
| 2016/0171133 A1 | 6/2016 | Pfister et al. | |

(Continued)

OTHER PUBLICATIONS

Tang, G et al. Vehicle hardware-in-the-loop simulation facility for driverless vehicle, 2nd International Conference on Power Electronics and Intelligent Transportation System [online], [retrieved on May 4, 2021], Retrieved from the Internet <URL: https://ieeexplore.ieee.org/document/5407031> (Year: 2009).*

(Continued)

*Primary Examiner* — Peter D Nolan
*Assistant Examiner* — Peter Y Ning
(74) *Attorney, Agent, or Firm* — Frank A. MacKenzie; Bejin Bieneman PLC

(57) ABSTRACT

A computer includes a processor and a memory, the memory storing instructions executable by the processor to collect control data indicating behavior of a vehicle controlled by a control program, collect virtual control data indicating behaviour of a virtual vehicle controlled by a virtual control program, and determine a difference between the control data and the virtual control data.

16 Claims, 1 Drawing Sheet

(56) References Cited

U.S. PATENT DOCUMENTS

| | | | |
|---|---|---|---|
| 2016/0210382 A1* | 7/2016 | Alaniz | G09B 19/167 |
| 2016/0253190 A1 | 9/2016 | Khan et al. | |
| 2016/0314224 A1* | 10/2016 | Wei | G06F 30/20 |
| 2017/0109928 A1 | 4/2017 | Micks et al. | |
| 2017/0132118 A1* | 5/2017 | Stefan | G06F 11/3668 |
| 2018/0052456 A1* | 2/2018 | Schoenfeld | G05D 1/0282 |
| 2018/0259976 A1* | 9/2018 | Williams | G01C 21/32 |
| 2021/0034679 A1* | 2/2021 | Cristache | G06K 9/00671 |

OTHER PUBLICATIONS

Huang, W et al. Autonomous Vehicles Testing Methods Review, IEEE 19th International Conference on Intelligent Transportation Systems, Rio de Janeiro, Brazil, Nov. 1-4, 2016 [online], [retrieved on May 4, 2021], Retrieved from the Internet <URL:https://ieeexplore.ieee.org/abstract/document/7795548> (Year: 2016).*

Koopman, P et al. Challenges in Autonomous Vehicle Testing and Validation, SAE Int. J. Trans. Safety, vol. 4, Issue 1 (Apr. 2016) [online], [retrieved on May 5, 2021], Retrieved at <URL: http://web.b.ebscohost.com/ehost/pdfviewer/pdfviewer?vid=1&SID=c8831395-6e87-4802-b754-8866cefd4194%40sessionmgr103> (Year: 2016).*

Kim, B et al. Testing Autonomous Vehicle Software in the Virtual Prototyping Environment, IEEE Embedded Systems Letters, vol. 9, No. 1, Mar. 2017 [online], [retrieved on May 5, 2021], Retrieved from the Internet <URL: https://ieeexplore.ieee.org/document/7797233> (Year: 2017).*

Gechter et al., "Towards a Hybrid Real/Virtual Simulation of Autonomous Vehicles for Critical", SIMUL 2014 : The Sixth International Conference on Advances in System Simulation, Copyright (c) IARIA, 2014; ISBN: 978-1-61208-371-1.

Lamotte, et al., "Submicroscopic and Physics Simulation of Autonomous and Intelligent Vehicles in Virtual Reality", 2010 Second International Conference on Advances in System Simulation.

Zofka et al., "Testing and Validating High Level Components for Automated Driving: Simulation Framework for Traffic Scenarios", 2016 IEEE Intelligent Vehicles Symposium (IV) Gothenburg, Sweden, Jun. 19-22, 2016.

* cited by examiner

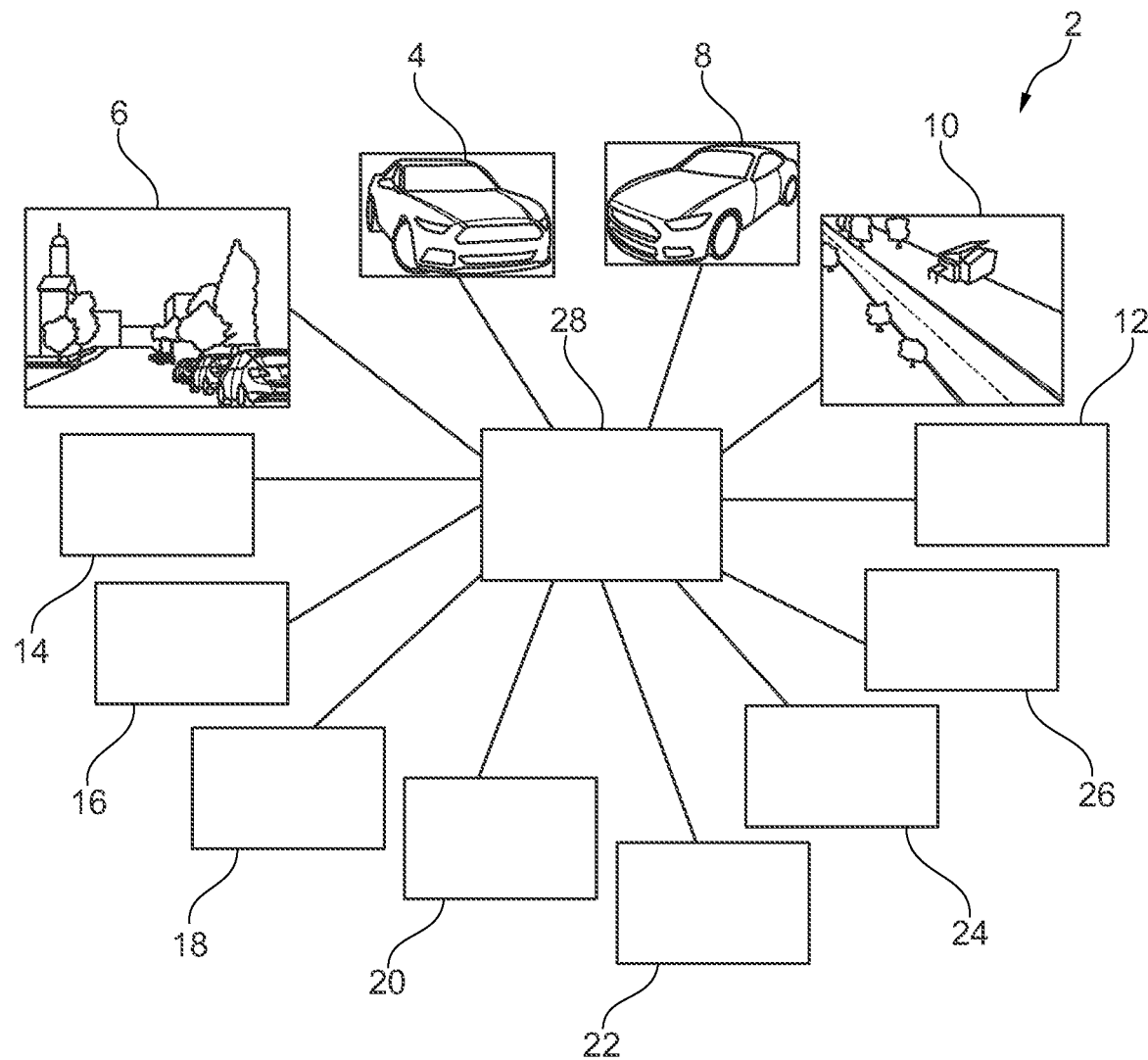

TEST FOR SELF-DRIVING MOTOR VEHICLE

CROSS-REFERENCE TO RELATED APPLICATION

This patent application claims priority to German Application No. DE 102018206189.0 filed on Apr. 23, 2018, which is hereby incorporated by reference in its entirety.

BACKGROUND

Self-driving motor vehicles, sometimes also known as autonomous ground vehicles, are motor vehicles that can drive, steer and park without any input from a human driver (highly automated or autonomous driving). The term "robot car" is also used for the case in which no manual control whatsoever is needed on the part of a driver. The driver's seat can stay unoccupied; there may be no steering wheel, brake pedal or gas pedal.

Self-driving motor vehicles can detect their environment using various sensors, and from the information obtained, determine their position and the other road-users, work with navigation software to drive to a destination, and avoid collisions on the way thereto.

The complexity and levels of autonomy of automated driving functions have risen constantly over the last ten years, presenting a new challenge for testing such software. Virtual test environments are used for this purpose in order to perform a significant part of the test runs. The virtual tests are also followed by real tests on a special test site, on which automated motor vehicles can be tested without interaction with public road users.

There is a need, however, to identify ways in which the results from the virtual tests and the real tests can be automatically merged and analyzed.

SUMMARY

The present disclosure relates to a system for testing a self-driving motor vehicle. The present disclosure includes a system for testing a self-driving motor vehicle, comprising the self-driving motor vehicle, a virtual motor vehicle, and a central module, wherein assigned to the self-driving motor vehicle is real control software that brings about a real world behavior of the self-driving motor vehicle, wherein assigned to the virtual motor vehicle is virtual control software that brings about a virtual world behavior of the virtual motor vehicle, and wherein the central module is designed to compare the real world behavior and the virtual world behavior and to provide a comparison result.

Thus, real tests are performed by the self-driving motor vehicle comprising its control software, the result of which tests is a real world behavior, for instance in the form of a dataset, whereas virtual tests are performed by the virtual motor vehicle comprising its virtual control software. The virtual motor vehicle comprising its virtual control software is understood to mean here a simulated motor vehicle comprising control software that is active in the simulation. Thus, the virtual world behavior is a result of a simulation, for instance in the form of a dataset.

The central module is designed to import in a single direction a dataset as a result of a real test, and a further dataset as a result of a virtual test, and to compare one with the other. In other words, the central module only receives datasets but does not send any data or datasets, for instance to the real or virtual control software.

The comparison result can be used to refine and improve a virtual test environment by automatically supplying the virtual test environment with real data. The comparison result can also be used for certification, homologation and/or autonomous driving approval. It can be employed for the back-to-back tests and/or regression tests of software updates in a continuous integration environment. In addition, the comparison result can be used to monitor the behavior of motor vehicles in the real world, and to detect deviations from normal behavior in good time.

According to one embodiment, assigned to the self-driving motor vehicle are a real data import system and a real vehicle response detection module, wherein the real data import system is designed to import sensor data from the self-driving motor vehicle, and the real vehicle response detection module is designed to analyze the sensor data in order to determine the real world behavior, and wherein assigned to the virtual motor vehicle are a virtual data import system and a virtual vehicle response detection module, wherein the virtual data import system is designed to import sensor data from the virtual motor vehicle, and the virtual vehicle response detection module is designed to analyze the sensor data in order to determine the virtual world behavior. During operation, the real data import system collects data from vehicle sensors, a GPS, from a Car-to-Infrastructure (C2I, also known as Vehicle-to-Roadside or V2R) system or Car-to-X (C2X) system, from a traffic database or from an internal vehicle bus such as a CAN bus, for instance. The real vehicle response detection module imports this sensor data, and by analyzing this data, determines a vehicle behavior of the self-driving motor vehicle in the real world. Likewise, the virtual data import system imports the corresponding data from simulated vehicle sensors, which the virtual vehicle response detection module imports and analyzes in order to determine the virtual world behavior. Thus conditioned data is available that can be compared particularly easily.

According to a further embodiment, the real vehicle response detection module provides a dataset representing a real-world trajectory of the motor vehicle, and the virtual vehicle response detection module provides a dataset representing a virtual world trajectory, wherein the central module compares the dataset representing the real-world trajectory and the dataset for the virtual world trajectory. Thus a movement path or curve for the motor vehicle is produced in each case. This allows a particularly simple and clear comparison.

According to a further embodiment, the control software differs from the virtual control software. It is hence possible to compare a newer version of the control software with an older version, and to check whether it differs in an intended or unintended manner. Alternatively, it is also possible to check a model of the vehicle behavior.

According to a further embodiment, the control software is the same as the virtual control software, and a quantity representing the differences is determined. The quantity representing the differences can be used to determine the accuracy of the simulation. It can be employed for further optimizations of the simulation itself.

According to a further embodiment, a virtual driving environment is used to determine a quality criterion for the control software. It is hence possible to check the functioning of the control software, and at the same time to determine a corresponding quality criterion for establishing the functional effectiveness, for instance such as maintaining a predetermined distance from a vehicle driving in front.

According to a further embodiment, a real driving environment is used. A comparison with the simulation is thereby possible, for instance in order to perform homologation.

The disclosure also includes a computer program product for a self-driving motor vehicle of such a system, a computer program product for a virtual motor vehicle of such a system, and a computer program product for a central module of such a system.

BRIEF DESCRIPTION OF THE DRAWING

FIG. 1 is a schematic diagram of a system for testing a self-driving motor vehicle.

DETAILED DESCRIPTION

In the present exemplary embodiment, the system 2 comprises a real motor vehicle 4, a real driving environment 6, a virtual motor vehicle 8, a virtual driving environment 10, a virtual environment generator 12, a communication module 14, real control software 16, virtual control software 18, a real data import system 20, a real vehicle response detection module 22, a virtual data import system 24, a virtual vehicle response detection module 26, and a central module 28.

Said components can comprise hardware and/or software components for their tasks and functions described below.

In the present exemplary embodiment, the real motor vehicle 4 is a car. In addition, in the present exemplary embodiment, the real motor vehicle 4 is embodied as a self-driving motor vehicle that can drive, steer and park without any input from a human driver. For this purpose, the real motor vehicle 4 comprises various sensors (not shown) for detecting the environment, and from the information obtained, can determine its position and the other road-users, work with the navigation software to drive to a destination, and avoid collisions on the way thereto.

The real driving environment 6 is a cordoned-off test site, on which the real motor vehicle 4 can be tested.

The virtual motor vehicle 8 is a software model of the real motor vehicle 4.

The virtual driving environment 10 is, for instance, a simulation of the real driving environment 6, though which the virtual motor vehicle 8 can be navigated. In other words, the virtual driving environment 10 is a software model of the real driving environment 6.

The virtual environment generator 12 imports real vehicle data such as, for example, sensor data, map and navigation data, or traffic data, and populates the virtual driving environment 10 with this data, for instance in order to simulate specific traffic situations.

The communication module 14 is used for the data transfer between the real and virtual components. Thus both online and offline simulations can be performed.

The real control software 16 controls the real motor vehicle 4, for instance when the real motor vehicle 4 is in the real driving environment 6.

The virtual control software 18 may be identical to the real control software 16, or they may be different software versions.

The real data import system 20 collects data from the real motor vehicle 4 during operation.

The real vehicle response detection module 22 imports the data and analyzes it to determine, in the present exemplary embodiment, a real vehicle trajectory.

During a simulation, for instance during a simulated journey of the virtual motor vehicle 8 through a virtual driving environment 10, the virtual data import system 24 collects data in a similar way to the real data import system 20.

Similarly, the virtual vehicle response detection module 26 imports the data and analyzes it to determine, in the present exemplary embodiment, a virtual vehicle trajectory.

The central module 28 imports the real vehicle trajectory and the virtual vehicle trajectory and compares one with the other.

During operation, real tests are performed first, for example, in which the real motor vehicle 4 is moved through a real driving environment 6 under the open-loop/closed-loop control of the real control software 16.

In this process, the real data import system 20 collects data, which the real vehicle response detection module 22 imports and analyzes to determine, for example, the real-world trajectory of the real motor vehicle 4.

In a further step, virtual tests are performed, in which the virtual motor vehicle 8 is moved through a virtual driving environment 10, which is provided by the virtual environment generator, under the open-loop/closed-loop control of the virtual control software 18.

In this process, the virtual data import system 24 collects data, which the virtual vehicle response detection module 26 imports and analyzes to determine, for example, the virtual world trajectory of the virtual motor vehicle 8.

The central module 28 then compares the real-world trajectory with the virtual world trajectory and provides a comparison result.

As an alternative to the present exemplary embodiment, the test can have a different sequence, for instance it is also possible to start with the virtual test followed by the real test, or the real and virtual tests are performed simultaneously, at least in part.

The comparison result can be used to refine and improve a virtual test environment by automatically supplying the virtual test environment with real data. The comparison result can also be used for certification, homologation and/or autonomous driving approval. It can be employed for the back-to-back tests and/or regression tests of software updates in a continuous integration environment. In addition, the comparison result can be used to monitor the behavior of motor vehicles in the real world, and to detect deviations from normal behavior in good time.

Hence the results from the virtual tests and the real tests can be automatically merged and analyzed.

LIST OF REFERENCES 2 system
4 real motor vehicle
6 real driving environment
8 virtual motor vehicle
10 virtual driving environment
12 virtual environment generator
14 communication module
16 real control software
18 virtual control software
20 real data import system
22 real vehicle response detection module
24 virtual data import system
26 virtual vehicle response detection module
28 central module

The invention claimed is:

1. A system, comprising a computer including a processor and a memory, the memory storing instructions executable by the processor to:
   collect, from one or more vehicle sensors, control data indicating a trajectory of a vehicle controlled by a control program according to a specified traffic scenario;
   collect virtual control data indicating a trajectory of a virtual vehicle controlled by a virtual control program according to the specified traffic scenario by which the vehicle is controlled by the control program;
   determine a difference between the control data and the virtual control data; and
   based on the difference, adjust one or more parameters of the virtual control program.

2. The system of claim 1, wherein the vehicle includes a data importer and a vehicle response detector, wherein the data importer is designed to import sensor data from the vehicle, and the vehicle response detector is designed to analyze the sensor data to determine behavior of the vehicle, and wherein the virtual vehicle includes a virtual data importer and a virtual vehicle response detector, wherein the virtual data importer is designed to import virtual sensor data from the virtual motor vehicle, and the virtual vehicle response detector is designed to analyze the virtual sensor data to determine behavior of the virtual vehicle.

3. The system of claim 2, wherein the vehicle response detector is programmed to provide a dataset including a trajectory of the vehicle, and the virtual vehicle response detector is programmed to provide a dataset representing a virtual trajectory of the virtual vehicle, and wherein the instructions further include instructions to compare the dataset including the trajectory and the dataset including the virtual trajectory.

4. The system of claim 1, wherein the control software differs from the virtual control software.

5. The system of claim 1, wherein the control software is the same as the virtual control software, and the instructions further include instructions to determine a quantity representing the differences between the control data and the virtual control data.

6. The system of claim 1, wherein the instructions further include instructions to determine a quality criterion for the control software in a virtual driving environment.

7. The system of claim 1, wherein the instructions further include instructions to collect the control data in a physical driving environment.

8. The system of claim 1, wherein the virtual vehicle is a virtual model of the vehicle.

9. A method, comprising:
   collecting, from one or more vehicle sensors, control data indicating a trajectory of a vehicle controlled by a control program according to a specified traffic scenario;
   collecting virtual control data indicating a trajectory of a virtual vehicle controlled by a virtual control program according to the specified traffic scenario by which the vehicle is controlled by the control program;
   determining a difference between the control data and the virtual control data; and
   based on the difference, adjust one or more parameters of the virtual control program.

10. The method of claim 9, wherein the vehicle includes a data importer and a vehicle response detector, wherein the data importer is designed to import sensor data from the vehicle, and the vehicle response detector is designed to analyze the sensor data to determine behavior of the vehicle, and wherein the virtual vehicle includes a virtual data importer and a virtual vehicle response detector, wherein the virtual data importer is designed to import virtual sensor data from the virtual motor vehicle, and the virtual vehicle response detector is designed to analyze the virtual sensor data to determine behavior of the virtual vehicle.

11. The method of claim 10, wherein the vehicle response detector is programmed to provide a dataset including a trajectory of the vehicle, and the virtual vehicle response detector is programmed to provide a dataset representing a virtual trajectory of the virtual vehicle, and wherein the instructions further include instructions to compare the dataset including the trajectory and the dataset including the virtual trajectory.

12. The method of claim 9, wherein the control software differs from the virtual control software.

13. The method of claim 9, wherein the control software is the same as the virtual control software, and the method further includes determining a quantity representing the differences between the control data and the virtual control data.

14. The method of claim 9, further comprising determining a quality criterion for the control software in a virtual driving environment.

15. The method of claim 9, further comprising collecting the control data in a physical driving environment.

16. The method of claim 9, wherein the virtual vehicle is a virtual model of the vehicle.

* * * * *